(12) United States Patent
Cobbley et al.

(10) Patent No.: US 7,998,305 B2
(45) Date of Patent: *Aug. 16, 2011

(54) ELECTRICAL INTERCONNECT USING LOCALLY CONDUCTIVE ADHESIVE

(75) Inventors: Chad A. Cobbley, Boise, ID (US); Steve W. Heppler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 320 days.

This patent is subject to a terminal disclaimer.

(21) Appl. No.: 11/960,034

(22) Filed: Dec. 19, 2007

(65) Prior Publication Data

US 2008/0093019 A1  Apr. 24, 2008

Related U.S. Application Data

(60) Continuation of application No. 10/873,552, filed on Jun. 22, 2004, now Pat. No. 7,326,316, which is a division of application No. 10/132,835, filed on Apr. 25, 2002, now Pat. No. 6,777,071.

(51) Int. Cl.
*B29C 65/52* (2006.01)
(52) U.S. Cl. ........................................ 156/330; 174/259
(58) Field of Classification Search .................. 156/330, 156/327, 307.1; 174/259; 428/403, 402, 428/402.2; 252/512, 519.3
See application file for complete search history.

(56) References Cited

U.S. PATENT DOCUMENTS

| | | | |
|---|---|---|---|
| 4,740,657 A | 4/1988 | Tsukagoshi et al. | |
| 4,999,460 A | 3/1991 | Sugiyama et al. | |
| 5,162,087 A * | 11/1992 | Fukuzawa et al. | 252/500 |
| 5,302,456 A * | 4/1994 | Matsui | 428/407 |
| 5,336,443 A | 8/1994 | Odashima | |
| 5,586,892 A * | 12/1996 | Sato | 439/91 |
| 5,686,703 A | 11/1997 | Yamaguchi | |
| 5,861,678 A * | 1/1999 | Schrock | 257/783 |
| 5,891,366 A | 4/1999 | Gruenwald et al. | |
| 5,932,339 A | 8/1999 | Sakurai et al. | |
| 5,965,064 A * | 10/1999 | Yamada et al. | 252/512 |
| 6,020,059 A | 2/2000 | Yamada et al. | |
| 6,194,492 B1 | 2/2001 | Sakurai et al. | |
| 6,331,679 B1 | 12/2001 | Higashi | |
| 6,582,763 B1 * | 6/2003 | Nishimura et al. | 427/216 |
| 6,777,071 B2 | 8/2004 | Cobbley et al. | |
| 7,326,316 B2 * | 2/2008 | Cobbley et al. | 156/330 |
| 2003/0215056 A1 | 11/2003 | Vuorela | |

OTHER PUBLICATIONS

Definition of "crush," http://m-w.com/dictionary/crush and http://www.thefreedictionary.com/crush, Dec. 10, 2009.*
Wikipedia definition of "creep" (http://en.wikipedia.org/w/index.php?title=Creep_%28deformation%29).
Webster's Third New International Dictionary, G. & C. Merriam Co., Springfield, MA (1981) at pp. 443, 546 and 593.
Webster's New World Dictionary, 3rd College Ed., Simon & Schuster, Inc. (1988) at p. 334.

* cited by examiner

*Primary Examiner* — Richard Crispino
*Assistant Examiner* — Daniel McNally
(74) *Attorney, Agent, or Firm* — Whyte Hirschboeck Dudek SC

(57) ABSTRACT

An anisotropic electrically conducting interconnect is disclosed in which an adhesive comprising particles having a breakable coating of at least one electrically nonconductive material is compressed between a first contact and a second contact. Compression to two contacts breaks the breakable coating exposing an electrically conducting material which makes contact with the first and second contacts. The electrically conducting material may be a metal conductor or a two-part reactive conductive resin/catalyst system. Also disclosed are processes for making such electrical interconnects and adhesives for use in making electrical interconnect.

28 Claims, 3 Drawing Sheets

ELECTRICAL INTERCONNECT USING LOCALLY CONDUCTIVE ADHESIVE

CROSS-REFERENCE TO RELATED APPLICATIONS

This application is a continuation of U.S. patent application Ser. No. 10/873,552, filed Jun. 22, 2004, now U.S. Pat. No. 7,326,316, issued Feb. 5, 2008, which is a division of U.S. patent application Ser. No. 10/132,835, filed Apr. 25, 2002, now U.S. Pat. No. 6,777,071, issued Aug. 17, 2004.

BACKGROUND OF THE INVENTION

This invention relates generally to semiconductors, and more specifically to methods and apparatus for making anisotropic electrical interconnects.

Anisotropic electrical interconnects are known in the art. U.S. Pat. No. 6,194,492 B1 discloses an anisotropic conductive film which exhibits a conductivity in the thickness direction thereof by pressurizing the film in the thickness direction, the film including: an adhesive; and conductive particles dispersed in the adhesive; wherein the adhesive is a thermosetting or photosetting adhesive containing as a main component at least one kind selected from a group consisting of (a) a polymer obtained by acetalation of a polyvinyl alcohol, (b) a compound containing an allyl group, (c) a monomer containing an acryloxy group or methacryloxy group, and (d) a polymer obtained by polymerization of one or more selected from a group consisting of an acrylic monomer and a methacrylic monomer.

U.S. Pat. No. 5,932,339 discloses an anisotropically electricity-conductive film obtainable by dispersing in an adhesive agent electrically conductive particles, the adhesive agent being a curable adhesive agent comprising as a major component at least one polymer selected from the group consisting of an ethylene-vinyl acetate copolymer; a copolymer of ethylene, vinyl acetate and an acrylate and/or methacrylate monomer; a copolymer of ethylene, vinyl acetate and maleic acid and/or maleic anhydride; a copolymer of ethylene, an acrylate and/or methacrylate monomer and maleic acid and/or maleic anhydride; and an ionomer resin wherein molecules of an ethylene-methacrylic acid copolymer are linked with each other through a metal ion.

U.S. Pat. No. 5,686,703 discloses an anisotropic, electrically conductive adhesive film including insulating adhesive, electrically conductive particles dispersed in the electrically insulating adhesive, and transparent, spherical glass particles dispersed in the insulating adhesive.

U.S. Pat. No. 5,162,087 discloses an anisotropic conductive adhesive composition comprising an insulating adhesive component and particles dispersed in said insulating adhesive component, said anisotropic conductive adhesive composition being characterized in that said insulating adhesive component comprises a copolymer of acrylic ester having an alkyl group of 1-4 carbon atoms and a maleimide derivative, 5 to 60 parts by weight, based on 100 parts by weight of the copolymer, of a thermosetting resin, and 0.05 to 5.0 parts by weight, based on 100 parts by weight of the copolymer, of a coupling agent, and said particles are metallic-layer containing particles comprising a core made of resin, a metallic layer covering said core and a resin layer formed from finely divided resin fixed by the dry blending method on the surface of said metallic layer.

U.S. Pat. No. 4,740,657 discloses an adhesive composition or film capable of exhibiting anisotropic-electroconductivity comprising electroconductive particles comprising polymeric core materials coated with thin metal layers, and electrically insulating adhesive component.

U.S. Pat. No. 5,965,064 discloses an anisotropically electroconductive adhesive to be used for establishing electric connection between terminals of, for example, an IC chip and of a circuit pattern, which adhesive comprises an electrically insulating adhesive matrix and electroconductive particles comprise at least two electroconductive particulate products of different average particle sizes and wherein each particle of both the particulate products is coated with an electrically insulating resin insoluble in the insulating adhesive matrix.

U.S. Pat. No. 5,302,456 discloses an anisotropic conductive material including micro-capsules dispersed in a bonding resin. The micro-capsules contain, as a filler material, a conductor and a polymerization initiator, a curing agent or a curing promotor. A wall member encapsulating the filler material is formed of a thermoplastic or thermosetting insulative resin. Therefore, if the micro-capsules in the anisotropic conductive material are broken or destroyed by pressure or both of pressure and heat, electrical connection can be established between electrode pads and electrode terminals of a wiring substrate through the conductors contained in the micro-capsules. Simultaneously, the polymerization initiator, the curing agent or the curing promotor flows out, so that the insulative bonding resin is solidified.

The above prior art typically achieves the anisotropic effect by controlling filler loading. In other words, to obtain an anisotropic interconnect the adhesive must use few particles. However, these prior art methods still have serious leakage problems if the filler loading is too high or too uneven. The filler loading is hard to control especially if the filler responds to gravity or magnetic fields.

BRIEF SUMMARY OF THE INVENTION

In one preferred embodiment, the invention is an electrical interconnect comprising (a) at least one first electrical contact; (b) at least one second electrical contact; and, (c) an adhesive interposed between and in contact with the first electrical contact and the second electrical contact, the adhesive comprising an electrically non-conductive resin and particles, the particles comprising at least one electrically conductive material and a breakable coating of at least one electrically non-conductive material, wherein the first electrical contact is positioned close enough to the second electrical contact to break the breakable coating of the particles in the interposed adhesive such that the electrically conducting material of the particles is exposed and in contact with both the first electrical contact and the second electrical contact, wherein the exposed electrically conducting material has sharp edges. This embodiment includes semiconductor dies or chips and semiconductor packages comprising such an interconnect.

In another preferred embodiment, the invention is an electrical interconnect comprising: (a) a first substrate having a surface and at least one first electrical contact projecting from the first substrate surface; (b) a second substrate having a surface and at least one second electrical contact projecting from the second substrate surface and aligned with the first electrical contact, such that the first substrate surface is substantially parallel to the second substrate surface; and, (c) an adhesive interposed between and in contact with the first substrate surface and electrical contact and the second substrate surface and electrical contact, the adhesive comprising an electrically non-conductive resin and particles, the particles comprising a core of at least one electrically conductive material and a breakable coating of at least one electrically non-conductive material, wherein the first electrical contact is positioned close enough to the second electrical contact to break the breakable coating material of the particles in the adhesive interposed between the first electrical contact and the second electrical contact such that the electrically conducting material of the particles is exposed and in contact with both the first electrical contact and the second electrical contact, wherein the exposed electrically conducting material has sharp edges, provided that the coating of the particles interposed between the first substrate surface and the second substrate surface, but not interposed between the first electrical contact and the second electrical contact, is not broken. This embodiment includes semiconductor dies or chips and semiconductor packages comprising such an interconnect.

In another preferred embodiment, the invention is an electrical interconnect comprising: (a) at least one first electrical contact; (b) at least one second electrical contact; and, (c) an adhesive interposed between and in contact with the first electrical contact and the second electrical contact, the adhesive comprising an electrically non-conductive resin and particles, the particles comprising a core of at least one electrically conductive reactive material and a breakable coating of at least one electrically non-conductive material, the core comprising: (1) at least one first subparticle comprising a reactive resin, having conductive material therein, encapsulated inside a rupturable membrane; and, (2) at least one second subparticle comprising a catalyst encapsulated inside a rupturable membrane, wherein the first electrical contact is positioned close enough to the second electrical contact to break the breakable coating of the particles in the interposed adhesive such that the first subparticle membrane and the second subparticle membrane are ruptured, whereby the reactive resin and the catalyst react to form a conductive adhesive between the first electrical contact and the second electrical contact. This embodiment includes semiconductor dies or chips and semiconductor packages comprising such an interconnect.

In yet another preferred embodiment, the invention is an electrical interconnect comprising: (a) a first substrate having a surface and at least one first electrical contact projecting from the first substrate surface; (b) a second substrate having a surface and at least one second electrical contact projecting from the second substrate surface and aligned with the first electrical contact, such that the first substrate surface is substantially parallel to the second substrate surface; and, (c) an adhesive interposed between and in contact with the first electrical contact and the second electrical contact, the adhesive comprising an electrically non-conductive resin and particles, the particles comprising a core of at least one electrically conductive reactive material and a breakable coating of at least one electrically non-conductive material, the core comprising: (1) at least one first subparticle comprising a reactive resin, having conductive material therein, encapsulated inside a rupturable membrane; and, (2) at least one second subparticle comprising a catalyst encapsulated inside a rupturable membrane, wherein the first electrical contact is positioned close enough to the second electrical contact to break the breakable coating of the particles in the interposed adhesive such that the first subparticle membrane and the second subparticle membrane are ruptured, whereby the reactive resin and the catalyst react to form a conductive adhesive between the first electrical contact and the second electrical contact provided that the coating of the particles interposed between the first substrate surface and the second substrate surface, but not interposed between the first electrical contact and the second electrical contact, is not broken. This embodiment includes semiconductor dies or chips and semiconductor packages comprising such an interconnect.

In yet another preferred embodiment, the invention is an electrical interconnect comprising: (a) at least one first electrical contact; (b) at least one second electrical contact; and, (c) an adhesive interposed between and in contact with the first electrical contact and the second electrical contact, the adhesive comprising: (1) an electrically non-conductive resin; (2) multiple first particles, each first particle comprising a core comprising at least one reactive resin, having an electrically conductive material therein, and a breakable coating of at least one electrically non-conductive material; and (3) multiple second particles, each second particle comprising a core comprising a catalyst and a breakable coating of at least one electrically non-conductive material, wherein the first electrical contact is positioned close enough to the second electrical contact to break the breakable coatings of the first particles and the second particles in the interposed adhesive, whereby the reactive resin and the catalyst react to form a conductive adhesive between the first electrical contact and the second electrical contact. This embodiment includes semiconductor dies or chips and semiconductor packages comprising such an interconnect.

In another preferred embodiment, the invention is an electrical interconnect comprising: (a) a first substrate having a surface and at least one first electrical contact projecting from the first substrate surface; (b) a second substrate having a surface and at least one second electrical contact projecting from the second substrate surface and aligned with the first electrical contact, such that the first substrate surface is substantially parallel to the second substrate surface; and, (c) an adhesive interposed between and in contact with the first electrical contact and the second electrical contact, the adhesive comprising: (1) an electrically non-conductive resin; (2) multiple first particles, each first particle comprising a core comprising at least one reactive resin, having an electrically conductive material therein, and a breakable coating of at least one electrically non-conductive material; and (3) multiple second particles, each second particle comprising a core comprising a catalyst and a breakable coating of at least one electrically non-conductive material, wherein the first electrical contact is positioned close enough to the second electrical contact to break the breakable coatings of the first particles and the second particles in the interposed adhesive, whereby the reactive resin and the catalyst react to form a conductive adhesive between the first electrical contact and the second electrical contact, contact provided that the coating of the particles interposed between the first substrate surface and the second substrate surface, but not interposed between the first electrical contact and the second electrical contact, is not broken. This embodiment includes semiconductor dies or chips and semiconductor packages comprising such an interconnect.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION OF THE INVENTION

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that electrical changes may be made without departing from the spirit and scope of the present invention.

The terms "wafer" or "substrate" used in the following description include any semiconductor-based structure having a silicon surface. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation. Preferred substrates are semiconductor structures such as semiconductor dies, semiconductor chips and semiconductor packages.

Figure 1:
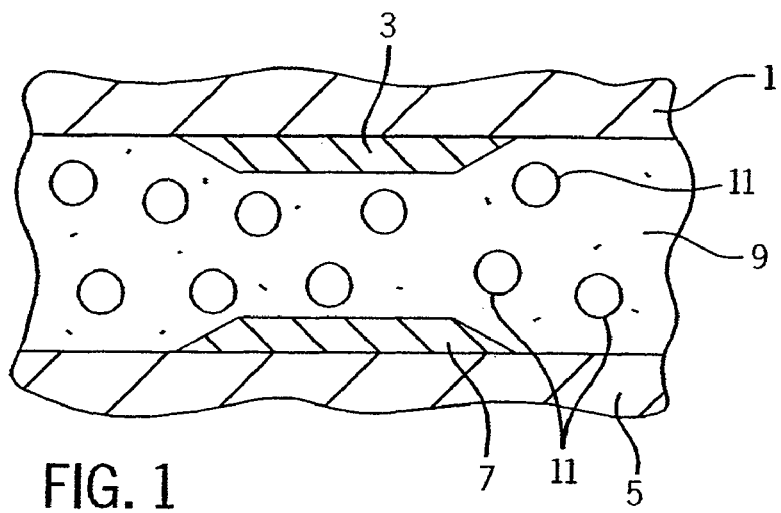
FIG. 1 is a schematic view of one embodiment of the apparatus of the invention prior to the formation of the interconnect.

FIG. 1 shows a step of a preferred process for making one embodiment of the inventive electric interconnect. A first substrate 1 having a first electrical contact 3 is positioned opposite a second substrate 5 having a second electrical contact 7. The first substrate 1 and the second substrate 5 are positioned relative to each other such that the first electrical contact 3 is aligned with the second electrical contact 7. An adhesive 9 is interposed between the first electrical contact 3 and the second electrical contact 7. The adhesive 9 comprises particles 11.

The adhesive 9 may be any insulating adhesive resin usable in the art. Such adhesives resins are described in U.S. Pat. No. 5,336,443, incorporated herein by reference, and include ethylene-vinyl acetate copolymeric resins unmodified or modified with carboxyl groups, copolymers of ethylene with methyl, ethyl or isobutyl acrylate, polyamide resins, polyester resins, poly(methyl methacrylate) resins, poly(vinyl ether) resins, poly(vinyl butyral) resins, polyurethane resins, styrene-butadiene-styrene block copolymers unmodified or modified with carboxyl groups, styrene-isoprene-styrene copolymeric resins, styrene-ethylene-butylene-styrene copolymers unmodified or modified with maleic acid, polybutadiene rubbers, polychloroprene rubbers unmodified or modified with carboxyl groups, styrene-butadiene copolymeric rubbers, isoprene-isobutylene copolymers, nitrile rubbers modified with carboxyl groups, epoxy resins, silicone resins and the like. These polymeric materials can be used either singly or as a combination of two kinds or more according to need.

It is optional that the above named adhesive polymeric material is admixed with a tackifier such as rosins and derivatives thereof, terpene resins, terpene-phenol copolymeric resins, petroleum resins, coumarone-indene resins, styrene-based resins, isoprene-based resins, phenolic resins, alkylphenol resins and the like either singly or as a combination of two kinds or more.

Further, the adhesive resin can optionally be admixed with various kinds of known additives including reaction aids, catalysts, or cross-linking agents such as phenolic resins, polyol compounds, isocyanate compounds, melamine resins, urea resins, urotropine compounds, amine compounds, acid anhydrides, organic peroxides, metal oxides, metal salts of an organic acid, e.g., chromium trifluoroacetate, alkoxides of a metal, e.g., titanium, zirconium and aluminum, and organometallic compounds, e.g., dibutyltin oxide, as well as photopolymerization initiators, e.g., 2,2-diethoxy acetophenone and benzil, sensitizer, e.g., amine compounds, phosphorus compounds and chlorine compounds, and so on. The adhesive 9 is preferably in the form of a film or a paste.

Preferably, the adhesive resin does not expand when cured, more preferably, the adhesive resin shrinks during cure.

The adhesive 9 may be positioned to interpose the two substrates before the first substrate 1 and the second substrate 5 are aligned in relation to each other. For example, the adhesive 9 may be deposited over the surface of one of the substrates followed by positioning the other substrate.

Figure 2:
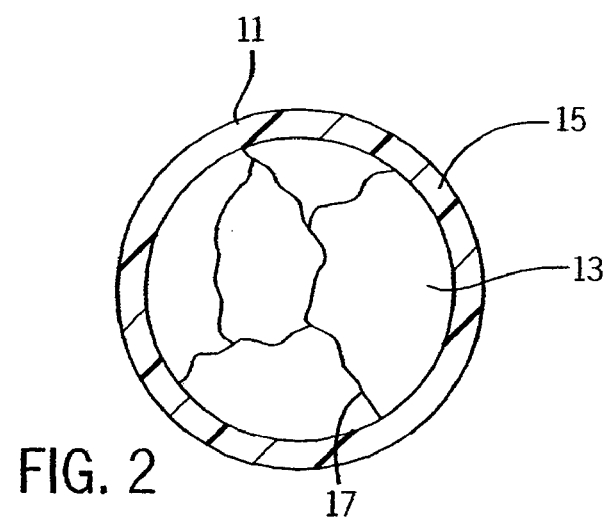
FIG. 2 is a cross-sectional view of a particle of FIG. 1.

FIG. 2 shows a cross-sectional view of one embodiment of particle 11. Typically, the particles 11 are generally rounded in shape, preferably spherical. Particles 11 typically have an average diameter of between about 0.5µ to about 100 µl. The particle 11 has a core 13 of an electrically conductive material, or a material that can react to form an electrically conductive material, surrounded by a breakable coating 15 of an electrically non-conducting material. Optionally, the core may be pre-broken to form fracture lines 17. The pre-broken core can be formed by thermally or chemically stressing the core. A pre-broken core may also be formed as an agglomeration of fragments.

In one preferred embodiment, the core 13 comprises any metal that will form sharp edges when fractured. The metal is preferably nickel, copper, silver or molybdenum. The metal can also be a metal that oxidizes in the presence of oxygen because the metal is in a controlled environment in the interconnect. The metal is preferably pre-cracked in order to facilitate the formation of sharp edges and surfaces on the metal when the particle is broken by compression. The sharp edges and surfaces ensure contact between the contact surfaces.

The breakable electrically non-conductive coating can be any appropriate material that can hold the conductive material together until the particles are broken by compression between the contacts. Examples of suitable electrically non-conductive materials include polymer resins and ceramics. A suitable ceramic is alumina oxide.

Figure 3:
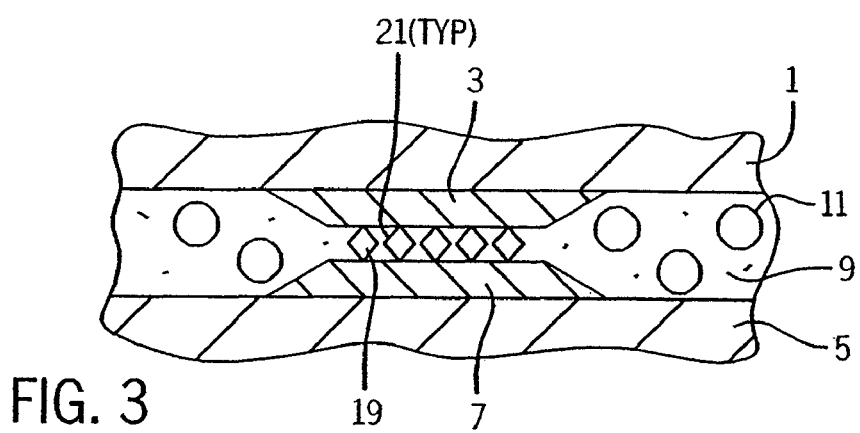
FIG. 3 is a schematic view of the apparatus of FIG. 1 at a processing step subsequent to forming the interconnect.

FIG. 3 shows the process after the interconnect has been formed. The first substrate 1 and the second substrate 5 have been repositioned closer to each other to compress the adhesive 9. In particular, the two substrates have been repositioned such that the electrically conducting particles 11 are compressed and broken between the first contact 3 and the second contact 7. The broken particles 19 preferably have sharp edges 21 to enhance the electrical connection between the broken particles 19 and the contacts. The broken particles 19 typically have an average largest dimension of about 0.1µ to about 20μ. The particles 11 in adhesive 9 which are not located between the contacts are not subjected to enough compression to break the coating on those particles. As such, an electrical connection is formed between the first contact 3 and the second contact 7 but the adhesive 9 and particles 11 not located between the two contacts remain non-electroconductive.

Figure 4:
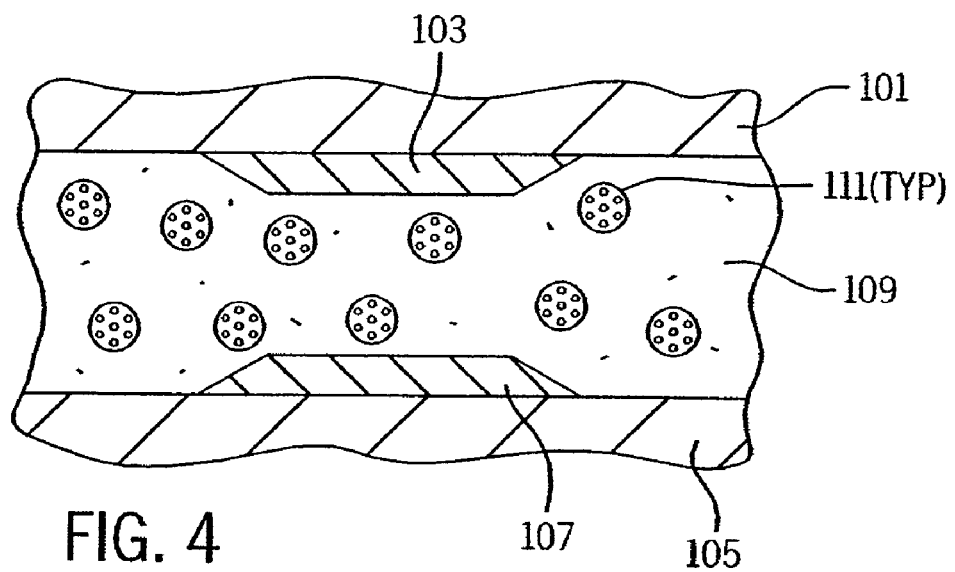
FIG. 4 is a schematic view of one embodiment of the apparatus of the invention prior to the formation of the interconnect.

FIG. 4 shows a step of this process for making another preferred embodiment the inventive electric interconnect. A first substrate 101 having a first electrical contact 103 is positioned opposite a second substrate 105 having a second electrical contact 107. The first substrate 101 and the second substrate 105 are positioned relative to each other such that the first electrical contact 103 is aligned with the second electrical contact 107. An adhesive 109 is interposed between the first electrical contact 103 and the second electrical contact 107. The adhesive 109 comprises particles 111.

The adhesive 109 may be any insulating adhesive resin usable in the art as described above. The adhesive 109 is preferably in the form of a film or a paste.

The adhesive 109 may be positioned to interpose the two substrates before the first substrate 101 and the second substrate 105 are aligned in relation to each other. For example, the adhesive 109 may be deposited over the surface of one of the substrates followed by positioning the other substrate.

Figure 5:
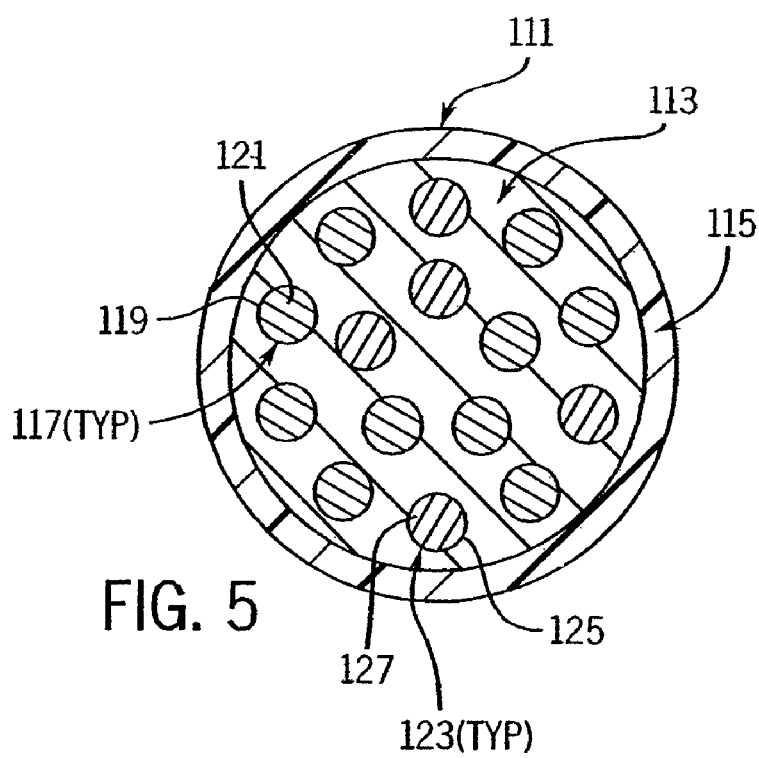
FIG. 5 is a cross-sectional view of a particle of FIG. 4.

FIG. 5 shows a cross-sectional view of the particle 111. Typically, the particles 111 are generally rounded in shape, preferably spherical. The particle 111 has a core 113 of a material that can react to form an electrically conductive material, surrounded by a breakable coating 115 of an electrically non-conducting material. Particle 111 typically has an average diameter of about 0.5μ to up to about 250μ.

Core 113 comprises a multiplicity of first subparticles 117 and second subparticles 123. First subparticles 117 comprise a rupturable membrane 119 and a reactive resin 121 which is electrically conductive. Rupturable membrane 119 may be made of any suitable organic material, for example, polymer resins insoluble in reactive resin 121. Reactive resin 121 can comprise any resin usable for adhesive 109, preferably an epoxy resin. Reactive resin 121 is rendered electrically conductive through filling with chunks of electrically conductive materials such as silver, nickel, copper, molybdenum. Second subparticle 123 comprises a rupturable membrane 125 and a catalyst 127 enclosed therein. Rupturable membrane 125 may be any suitable organic material that is insoluble in catalyst 127, preferably a polymer resin. Catalyst 127 is selected to react with reactive resin 121 to form a cured adhesive.

The breakable electrically non-conductive coating 115 can be any appropriate material that can hold the conductive material together until the particles are broken by compression between the contacts. Examples of suitable electrically non-conductive materials include polymer resins and ceramics. A suitable ceramic is alumina oxide.

Figure 6:
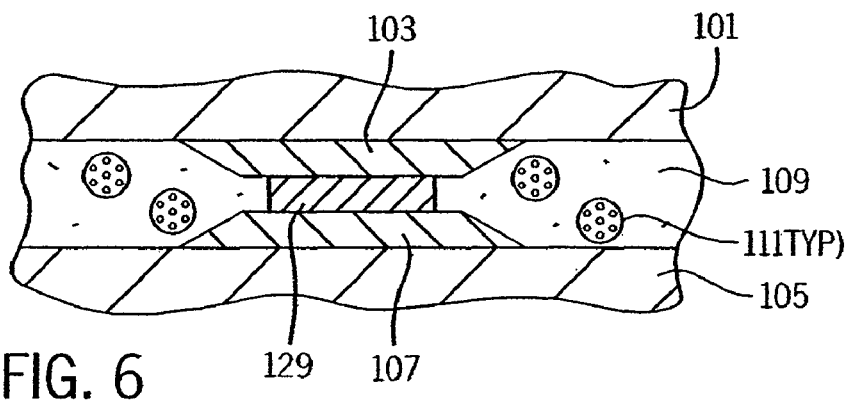
FIG. 6 is a schematic view of the apparatus of FIG. 4 at a processing step subsequent to forming the interconnect.

FIG. 6 shows the process after the interconnect has been formed. The first substrate 101 and the second substrate 105 have been repositioned closer to each other to compress the adhesive 109. In particular, the two substrates have been repositioned such that the particles 111 are compressed and broken between the first contact 103 and the second contact 107.

When particles 111 are compressed and broken, membranes 119 of first subparticles 117 and 125 of second subparticle 123 are ruptured permitting reactive resin 121 and catalyst 127 to intermingle and react. As a result, a cured adhesive bond 129 is formed between first contact 103 and second contact 107 wherein the adhesive is electrically conductive.

Figure 7:
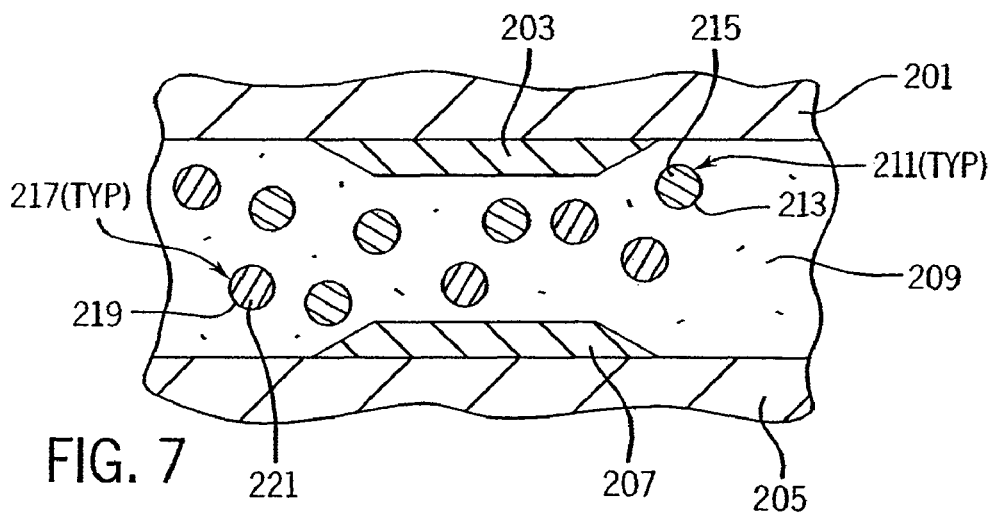
FIG. 7 is a schematic cross-section view of one embodiment of the apparatus of the invention prior to the formation of the interconnect.

FIG. 7 shows a cross-sectional view of a process for making one embodiment of the inventive electric interconnect. A first substrate 201 having a first electrical contact 203 is positioned opposite a second substrate 205 having a second electrical contact 207. The first substrate 201 and the second substrate 205 are positioned relative to each other such that the first electrical contact 203 is aligned with the second electrical contact 207. An adhesive 209 is interposed between the first electrical contact 203 and the second electrical contact 207. The adhesive 209 comprises first particles 211 and second particles 217.

The adhesive 209 may be any insulating adhesive resin usable in the art as described above. The adhesive 209 is preferably in the form of a film or a paste.

The adhesive 209 may be positioned to interpose the two substrates before the first substrate 201 and the second substrate 205 are aligned in relation to each other. For example, the adhesive 209 may be deposited over the surface of one of the substrates followed by positioning the other substrate.

First particle 211 comprises a conductive resin 215 contained within a breakable coating 213 of an electrically non-conducting material. Conductive resin 215 comprises one-half of a two-part adhesive, preferably an epoxy resin, filled with electrically conducting material. The electrically conducting material is preferably silver but may also be nickel, copper or molybdenum. The breakable electrically non-conductive coating 215 can be any appropriate material that can hold the conductive material together until the particles are broken by compression between the contacts. Examples of suitable electrically non-conductive materials include polymer resins and ceramics. A suitable ceramic is alumina oxide.

Second particle 217 comprises a catalyst 221 encased within a breakable coating 219 made from an electrically nonconducting material. The catalyst 221 is selected to react with the conductive resin 215 as the other component of the two-part adhesive, preferably an epoxy resin. The breakable electrically non-conductive coating 219 can be any appropriate material that can hold the conductive material together until the particles are broken by compression between the contacts. Examples of suitable electrically non-conductive materials include polymer resins and ceramics. A suitable ceramic is alumina oxide.

Figure 8:
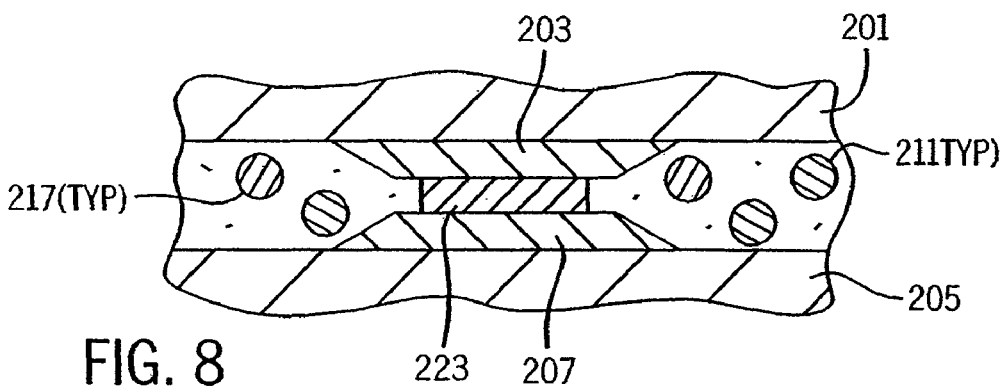
FIG. 8 is a schematic cross-section view of the apparatus of FIG. 7 at a processing step subsequent to forming the interconnect.

FIG. 8 shows the process after the interconnect has been formed. The first substrate 201 and the second substrate 205 have been repositioned closer to each other to compress the adhesive 209. In particular, the two substrates have been repositioned such that the particles 211 and the second particles 217 are compressed and broken between the first contact 203 and the second contact 207. The conductive resin 215 from broken first particles 211 intermingles with and reacts with the catalyst 221 from broken second particles 217. The reaction of conductive resin 215 with catalyst 221 results in a cured adhesive 223. First particles 211 and second particles 217 which are not located between first contact 203 and second contact 207 are not broken in the compression step.

The electrical interconnect of the current invention is usable for any interconnection between two semiconductor parts each having a contact. In particular, the inventive interconnect is usable on semiconductor dies, chips or package. The inventive adhesive could replace solder paste in forming interconnects with die, chips and packages. The inventive adhesive can also be used as a surface mount material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for preparing a conductive interconnect, comprising:

applying an adhesive material on a surface of a first substrate and over an electrical contact protruding from said surface, the adhesive material comprising a resin that does not expand upon curing and particles comprising a pre-cracked core of an electrically conductive material within a coating of an electrically non-conducting material;

mounting a second substrate on the first substrate with the adhesive material therebetween, the second substrate comprising an electrical contact protruding from a surface and aligned with the electrical contact on the first substrate; and positioning said first and second substrates such that the coating and the core of at least some of the particles situated within the adhesive material between said aligned electrical contacts are broken and the conducting material of said particles is exposed and in contact with said electrical contacts.

2. The method of claim 1, wherein the pre-cracked core of the particles comprises fracture lines.

3. The method of claim 2, further comprising, treating to pre-crack the core of the particles to form said fracture lines therein.

4. The method of claim 3, wherein treating to pre-crack the core of the particles comprises thermally or chemically stressing the core of the particles to form said fracture lines.

5. The method of claim 1, wherein the coating of the particles comprises an electrically non-conductive material selected from the group consisting of polymer resins and ceramics.

6. The method of claim 5, wherein the electrically non-conductive material comprises alumina oxide.

7. The method of claim 1, wherein the adhesive is in the form of a paste.

8. The method of claim 1, wherein the adhesive is in the form of a film.

9. The method of claim 1, wherein the particles have a diameter of about 0.5-100μ.

10. The method of claim 1, wherein the pre-cracked core of the particles comprises an agglomeration of fragments.

11. The method of claim 1, wherein the core of the particles comprises a metal that will form sharp edges when fractured.

12. The method of claim 1, wherein the core of the particles comprises a metal selected from the group consisting of nickel, copper, silver and molybdenum.

13. The method of claim 1, wherein the core of the particles comprises a metal that oxidizes in the presence of oxygen.

14. A method for preparing an electrical interconnect, comprising:

positioning a first substrate opposite and substantially parallel to a second substrate, each of said substrates having an electrical contact on a surface, said electrical contacts being aligned with an adhesive material therebetween, the adhesive comprising at least one resin and a plurality of particles, the particles comprising a pre-cracked core of an electrically conductive material within a coating of an electrically non-conductive material, wherein the adhesive resin does not expand upon curing;

moving at least one of the substrates to break the coating and the core of at least some of the particles in the adhesive material between the contacts such that the electrically conducting material of the particles is exposed and in contact with both of said electrical contacts.

15. The method of claim 14, wherein the pre-cracked core of the particles comprises fracture lines.

16. The method of claim 14, wherein the pre-cracked core of the particles comprises an agglomeration of fragments.

17. A method for preparing a conductive interconnect, comprising:

applying an adhesive material on a surface of a first substrate and over an electrical contact protruding from said surface, the adhesive material comprising a resin that does not expand upon curing and first and second particles comprising a core of a material surrounded by a coating of an electrically non-conducting material, the material of the first particle reactive with the material of the second particle to form an electrically conductive material mounting a second substrate on the first substrate with the adhesive material therebetween, the second substrate comprising an electrical contact protruding from a surface and aligned with the electrical contact on the first substrate; and breaking the coating and the core of at least some of the first and second particles by compression of the adhesive material between said electrical contacts on the first and second substrates such that the material of said broken cores of the first and second particles reacts to form the electrically conductive material in contact with said electrical contacts.

18. A method for preparing a conductive interconnect, comprising:

applying an adhesive material on a surface of a first substrate and over an electrical contact protruding from said surface, the adhesive material comprising a resin that does not expand upon curing and particles comprising a core within a coating of an electrically non-conducting material, the core of the particles comprising a first subparticle and a second subparticle, the first subparticle comprising a core comprising a reactive resin within a rupturable membrane, and the second subparticle comprising a core comprising a catalyst within a rupturable membrane;

mounting a second substrate on the first substrate with the adhesive material therebetween, the second substrate comprising an electrical contact protruding from a surface and aligned with the electrical contact on the first substrate; and moving said aligned electrical contacts together to break the coating of at least some of the particles in the adhesive situated between said electrical contacts such that the membranes of the first and second subparticles of said particles are ruptured and the reactive resin and the catalyst react to form an electrically conductive second adhesive material between and in contact with said electrical contacts.

19. The method of claim 18, wherein the rupturable membrane of the first subparticles comprises an organic material that is insoluble in said reactive resin.

20. The method of claim 19, wherein the organic material comprises a polymer resin.

21. The method of claim 18, wherein the reactive resin of the first subparticles comprises an epoxy resin and an electrically conductive material.

22. The method of claim 21, wherein the electrically conductive material is selected from the group consisting of silver, nickel, copper, and molybdenum.

23. The method of claim 18, wherein the rupturable membrane of the second subparticles comprises an organic material that is insoluble in said catalyst.

24. The method of claim 23, wherein the organic material comprises a polymer resin.

25. The method of claim 18, wherein the catalyst of the second subparticles is reactive with said reactive resin to form a cured adhesive.

26. The method of claim 18, wherein neither the first nor second adhesives expand upon curing.

27. The method of claim 18, wherein the coating of the particles remains unbroken on at least some of the particles in a portion of the adhesive material that is not situated between said electrical contacts.

28. A method for preparing an electrical interconnect, comprising:
    positioning a first substrate opposite and substantially parallel to a second substrate, each of said substrates having an electrical contact on a surface, said electrical contacts being aligned with an adhesive material therebetween, the adhesive comprising at least one resin that does not expand upon curing and a plurality of particles, the particles comprising a core within a coating of an electrically non-conductive material, the core of the particles comprising a first subparticle and a second subparticle, the first subparticle comprising a core comprising a reactive resin within a rupturable membrane, and the second subparticle comprising a core comprising a catalyst within a rupturable membrane;
    moving at least one of the substrates to break the coating and the core of at least some of the particles in the adhesive material between the contacts such that the membranes of the first and second subparticles of said particles are ruptured and the reactive resin and the catalyst react to form an electrically conductive second adhesive material between and in contact with said electrical contacts.

* * * * *